United States Patent [19]
Xu

[11] Patent Number: 6,066,985
[45] Date of Patent: May 23, 2000

[54] LARGE SWING INPUT/OUTPUT ANALOG BUFFER

[75] Inventor: Ping Xu, Milpitas, Calif.

[73] Assignee: Seiko Epson Corporation, Tokyo, Japan

[21] Appl. No.: 09/152,026

[22] Filed: Sep. 10, 1998

[51] Int. Cl.[7] ...................................................... H03F 3/45
[52] U.S. Cl. ........................................... 330/253; 330/255
[58] Field of Search .................................... 330/255, 253, 330/261, 264, 269

[56] References Cited

U.S. PATENT DOCUMENTS

| | | |
|---|---|---|
| 4,480,230 | 10/1984 | Brehmer et al. . |
| 4,730,168 | 3/1988 | Senderowicz et al. . |
| 4,739,281 | 4/1988 | Doyle . |
| 4,881,045 | 11/1989 | Dillman . |
| 4,935,703 | 6/1990 | Poletto . |
| 5,130,666 | 7/1992 | Nicollini ................................. 330/253 |
| 5,210,506 | 5/1993 | Koch et al. . |
| 5,515,006 | 5/1996 | Chan . |
| 5,907,259 | 5/1999 | Yamada et al. .......................... 327/563 |

*Primary Examiner*—Robert Pascal
*Assistant Examiner*—Henry Choe

[57] ABSTRACT

An analog buffer comprising a bias circuit, an n input stage, a p-input stage, and a push-pull output stage which generates an output voltage signal and which is configured and operated such that the output voltage signal is able to quickly and accurately respond to changes in the input voltage signal. The push-pull output stage comprises a pair of output transistors which having a common drain connection forming an output node where the output voltage signal is generated. The push-pull output stage further comprises a first group of PMOS transistors, one of which is responsive to a first control signal generated in the n-input stage to increase the output signal in response to an increase in the input signal, and a second group of NMOS transistors, one of which is responsive to a second control signal generated in the p-input stage to decrease the output signal in response to a decrease in the input signal. A third group of MOS transistors assists in increasing the output signal in response to an increase in the input signal at a relatively high end of the input signal range, and a fourth group of MOS transistors assists in decreasing the output signal in response to a decrease in the input signal at a relatively low end of the input signal range.

25 Claims, 4 Drawing Sheets

LARGE SWING INPUT/OUTPUT ANALOG BUFFER

BACKGROUND OF THE INVENTION

1. Field of the Invention

This invention pertains to a large swing input/output analog buffer, and more particularly to a large swing input/output analog buffer that has a push-pull output stage which provides the buffer with improved performance characteristics and low power consumption. The large swing input/output analog buffer of this invention is designed to be used in many applications including scanners and other imaging devices.

2. Description of the Related Art

Analog buffer circuits are widely used in analog circuit design. Such buffers typically have high input impedance and low output impedance to provide high speed and large driving ability. The buffers are used to provide an output signal which tracks its input signal.

Figure 1:
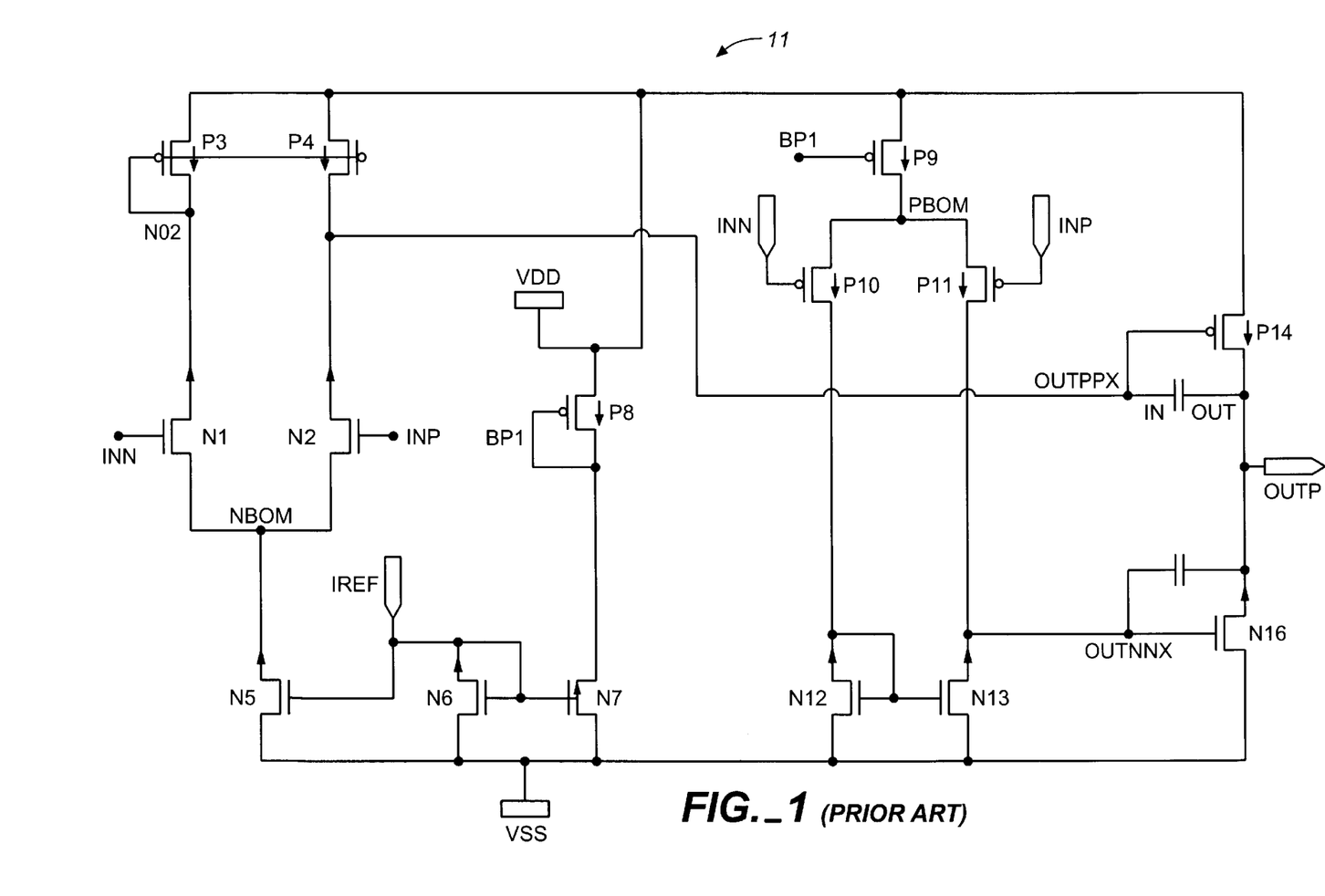
FIG. 1 is a circuit diagram of a conventional analog buffer.

FIG. 1 shows one such conventional analog buffer, identified generally by the reference numeral 11. Analog buffer 11 has both an n-input stage and a n-input stage, as well as a bias circuit and an output stage. Two voltage sources, VDD and VSS, may be used to power the circuit. Alternatively, only VDD may be used with VSS grounded.

The n-input stage includes a pair of NMOS input transistors N1 and N2 which receive input voltage signals INN and INP respectively. The n-input stage further includes two PMOS load transistors, P3 and P4, connected in current mirror configuration. Current source transistor N5 is connected in current mirror configuration with transistor N6 in then bias circuit. A reference current (IREF) is supplied to the drain of N6 to induce a current in N5 as a result of the current mirror connection between these two transistors.

In addition to N6, the bias circuit further comprises transistor N7, which also forms a current mirror with N6, and a third transistor P8 whose gate and drain are coupled to the drain of N7. The gate and drain of P8 are also connected to the gate of current source transistor P9 in the p-input stage to form a current mirror. As a result of this connection, then current in P8 induces a current in P9 to provide a source current for the p-input stage.

The p-input stage further includes a pair of PMOS input transistors P10 and P11 which receive input voltage signals INN and INP respectively. Two NMOS load transistors N12 and N13, interconnected in current mirror configuration, are also provided.

The n- and p-input stages generate voltage signals OUTPPX and OUTNNX respectively. OUTPPX is applied to the gate of transistor P14 and OUTNNX is applied to the gate of N16. These two transistors collectively comprise the output stage of analog buffer 11. The nodes where OUTPPX and OUTNNX are generated are also coupled through capacitors C1 and C2 to the common drain connection between the two output transistors. This common drain connection also forms the output node from which output voltage signal OUTP is taken.

In accordance with analog buffer operation, the output node where voltage signal OUTP is generated is connected to the node where input voltage signal INN is applied to provide a bi-directional driving current which gives the buffer 11 a relatively fast settling time for charging and discharging load capacitances (up to 5 pF). In this case, INTP is the input signal. However, because the nodes where voltages OUTPPX and OUTNNX are generated are floating, those voltages can fluctuate over a very large range. This can cause the NMOS transistor, N16, which is gated by OUTNNX, to fully turn on when INP is relatively high (i.e., near VDD) and PMOS transistor P14, which is gated by OUTPPX, to fully turn on when INP is relatively low (i.e., near VSS). This, in turn, will limit the output range so that OUTP does not closely track INP at the high and low ends of the voltage range and will also lower the driving ability of the buffer 11. This will also cause the buffer 11 to draw a large dc current from the power supply even when the buffer 11 is in an idle state (i.e., no input signal is applied).

OBJECTS OF THE INVENTION

Therefore, it is an object of this invention to overcome the aforementioned problems.

It is another object of this invention to provide an improved analog buffer circuit having a relatively large input/output range.

It is a further object of this invention to provide a large swing input/output analog buffer that generates an output signal which tracks the input signal very closely even at the high and low ends of the input voltage range.

It is yet another object of this invention to provide a large swing input/output analog buffer having a push-pull output stage to draw only a small amount of dc current from the power supply during normal operation and minimal current when the buffer is in a power down mode.

SUMMARY OF THE INVENTION

An analog buffer is provided comprising an input stage, preferably comprising an n-input stage and a p-input stage, and a push-pull output stage. The n-input stage comprises a pair of input NMOS transistors which receive an input voltage signal and which are coupled together to form a node where a first voltage control signal is generated, and the p-input stage comprises a pair of input PMOS transistors which also receive the voltage input signal and which are coupled together to form a node where a second voltage control signal is generated. The push-pull output stage generates an output voltage signal and is configured and operated such that the output voltage signal is able to quickly and accurately respond to changes in the input voltage signal.

The push-pull output stage comprises a plurality of groups of MOS transistors and a pair of output transistors. One of the output transistors is of the PMOS type and is biased by a third voltage control signal and the other output transistor is of the NMOS type and is biased by a fourth voltage control signal. The output transistors have a common drain connection forming an output node where the output voltage signal is generated. A first group of PMOS transistors, one of which is responsive to the first control signal, acts to increase the output signal in response to an increase in the input signal, and a second group of NMOS transistors, one of which is responsive to the second control signal, acts to decrease the output signal in response to a decrease in the input signal. A third group of MOS transistors comprising a PMOS and an NMOS transistor assists in increasing the output signal in response to an increase in the input signal at a relatively high end of the input signal range, and a fourth group of MOS transistors comprising a PMOS and an NMOS transistor assists in decreasing the output signal in response to a decrease in the input signal at a relatively low end of the input signal range.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 2:
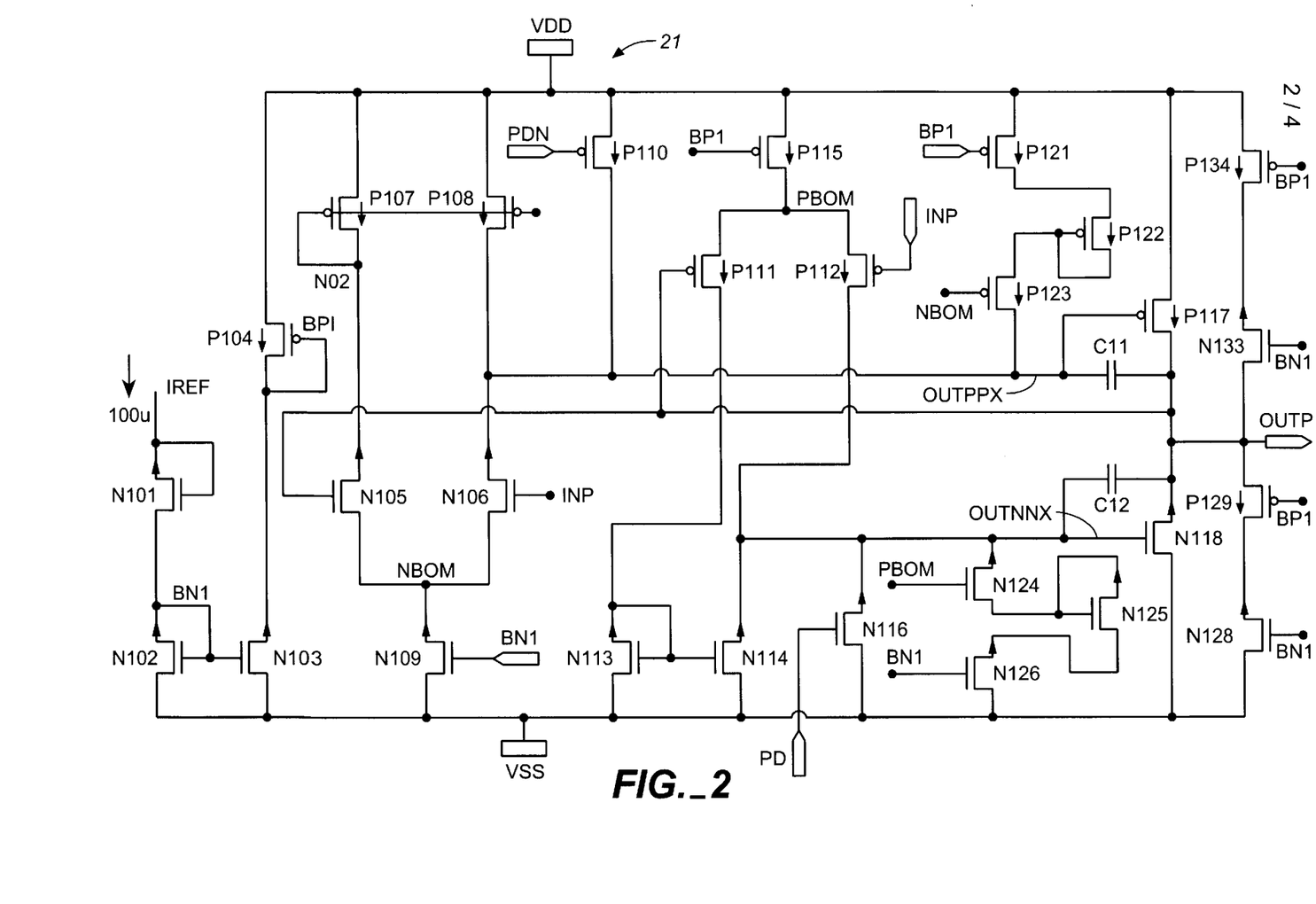
FIG. 2 is circuit diagram of a large swing input/output analog buffer constructed in accordance with embodiments of the invention.

Referring to FIG. 2, a diagram of a large swing input/output analog buffer 21 is illustrated in accordance with preferred embodiments of the invention. As shown in FIG. 2, analog buffer 21 has four parts: a bias circuit, an n-input stage, a p-input stage, and a push-pull output stage. In accordance with CMOS technology, analog buffer 21 comprises a plurality of MOS transistors of both the NMOS and PMOS type. In the description and drawings herein NMOS transistors are designated with the prefix N and PMOS transistors with the prefix P.

The bias circuit receives a small input reference current, designated as IREF. This input current, which may be, for example, 100–150 µA, is introduced at the drain of transistor N101 and flows through this transistor and through transistor N102. The drain and gate of N102 are connected to the source of N10 to form a node where voltage signal BN1 is generated. Transistor N102 is connected in current mirror configuration with transistor N103 to generate current in the branch containing N103 and P104. The drain of N103 is coupled to the drain and gate of transistor P104 to form a node where a voltage signal BP1 is produced. The source of P104 is connected to a first supply voltage VDD which may be, for example, 3.3 V or 5.0 V. The sources of N102 and N103 are coupled to VSS which may be ground or may be a second supply voltage.

The n-input stage comprises a pair of input transistors N105 and N106 for receiving a differential input voltage signal which represents the difference between an input voltage signal INP and the output voltage signal OUTP generated by the buffer 21. OUTP and INP are applied to the gates of N105 and N106 respectively. A pair of load transistors P107 and P108, connected in current mirror configuration, are coupled to input transistors N105 and N106. The common drain connection between N105 and P107 forms a node having voltage N02 while the common drain connection between N106 and P108 forms a node off of which a voltage signal OUTPPX is taken. The n-input stage further includes a current source transistor N109, the drain of which is coupled to each of the sources of N105 and N106 to form a node where voltage signal NBOM is generated. The gate of N109 is biased by voltage signal BN1 from the bias circuit. The source of N109 is connected to VSS. A transistor P110 is interconnected between VDD and the node where OUTPPX is generated and has a gate that is responsive to a power down voltage PDN which may be generated by an external power down circuit.

The p-input stage comprises a pair of input transistors P111 and P112 which also receive the same differential input voltage signal applied to the n-input stage. OUTP and INP are applied to the gates of P111 and P112 respectively. A pair of load transistors N113 and N114, connected in current mirror configuration, are coupled to input transistors P111 and P112. The common drain connection between P112 and N114 forms a node off of which a voltage signal OUTNNX is taken. The p-input stage further includes a current source transistor P115, the drain of which is coupled to each of the sources of P111 and P112 to form a node where voltage signal PBOM is generated. The gate of P115 is biased by voltage signal BP1 from the bias circuit. The source of P115 is connected to VDD. A transistor N116 is interconnected between VSS and the node where OUTNNX is generated and has a gate that is responsive to a power down voltage PD generated by the power down circuit.

In accordance with the invention, analog buffer 21 further comprises a push-pull output stage that includes a pair of output transistors, P117 and N118, having a common drain connection off of which the output voltage signal OUTP is taken. The gate of P117 is driven by OUTPPX and the gate of N118 is driven by OUTNNX. The push-pull output stage further includes a plurality of groups of transistors to adjust the output voltage OUTP to closely track changes to input voltage INP and to control the current supplied to and discharged from the load (not shown), particularly at the high and low (ends of the input voltage range.

A first group of transistors in the push-pull output stage, designated by P121, P122 and P123, are connected in series, as shown in FIG. 2, with the drain of P121 coupled to the source of P122 and the drain aid gate of P122 coupled to the source of P123. The source of P121 is connected to VDD and the drain of P123 is coupled to the node where OUTPPX is produced. The gates of P121 and P123 are biased by voltage signals BP1 and NBOM respectively. P121, P122 and P123 act to restrict the current flow therethrough as input voltage INP increases to increase the output voltage OUTP.

A second group is comprised of NMOS transistors N124, N125 and N126 that are connected in series to form a unit which is structurally and functionally complementary to the first group of PMOS transistors. As shown in FIG. 2, the source of N124 is coupled to the drain and gate of N125 and the source of N125 is coupled to the drain of N126. The drain of N124 is connected to the node where OUTNNX is generated and the source of N126 is connected to VSS. The gates of N124 and N126 are biased by voltage signals PBOM and BN1 respectively. N124, N125 and N126 act to restrict the current flow therethrough as input voltage INP decreases to cause the output voltage OUTP to decrease.

The push-pull output stage further comprises two pairs of charge/discharge current source transistors. One pair, designated as N128 and P129, is connected between the output node and VSS, as shown in FIG. 2. The other pair, which comprises transistors N133 and P134, is connected between VDD and the output node. N128 and N133 are biased by voltage signal BN1 and P129 and P134 are biased by voltage signal BP1. In the middle of the INP/OUTP voltage range (i.e., from approximately VSS+0.4 V to VDD−0.4 V), each of these transistors N128, P129, N133 and P134 are off or nearly off, conducting, at most, only a small amount of current. However, at the high and low ends of the input/ output voltage range (i.e. within approximately 0.4 V of VDD and VSS), one or the other of these pairs of transistors is on to provide pull down/pull up current at the output node to assist in enabling the output voltage OUTP to quickly respond to changes in INP at the extreme ends of the voltage range.

The output voltage node from which OUTP is taken is coupled to each of the nodes where OUTNNX and OUTPPX are generated through capacitors C11 and C12. Capacitors C11 and C12 are preferably synthetic film capacitors which may be, for example, double-poly capacitors. Capacitors C11 and C12 minimize oscillations in the buffer circuit 21 and should have capacitances of about 0.4 and 0.8 pF respectively.

In operation, the voltages OUTPPX and OUTNNX are respectively controlled by voltages NBOM and PBOM through the two groups of transistors: P121, P122 and P123; and N124, N125 and N126. NBOM and PBOM are, in turn, controlled by input signal INP. As INP increases, NBOM and PBOM each also increase proportionately. NBOM is the voltage applied to the gate of P123, and as this voltage increases, the current flow through P121, P122 and P123 decreases, causing OUTPPX to decrease which, in turn, causes P117 to conduct more current. Thus, more current charges the load capacitance of up to 5 pF through P117 causing OUTP to increase. At the same time, as PBOM increases, a larger current is induced in N124, N125 and N126, with the upper limit of this current flow being controlled by BN1 which is generated in the bias circuit and applied to the gate of N126. Subject to this upper limit, as the current in N124, N125 and N126 increases, OUTNNX decreases which may cause N118 to partially or completely turn off. This will enable OUTP to quickly increase to closely track INP, particularly at the high end of the voltage range. To further assist OUTP to quickly and accurately respond to increases in INP at the high end of the voltage range, transistors N128 and P129 will remain on while transistors N133 and P134 will be partially or completely off to provide some "pull down" discharge current at the output node. So, even if input transistors P111 and P112 and output transistor N118 turn off, there is still "pull down" current from N128 and P129.

As INP decreases, NBOM and PBOM each also decrease proportionately. As PBOM decreases, the current flow through N124, N125 and N126 decreases. This causes the voltage OUTNNX to increase which, in turn, causes N118 to conduct more current. Thus, more current discharges from the load through N118 causing OUTP to decrease. At the same time, as NBOM decreases, a larger current is induced in P121, P122 and P123, with the upper limit of this current flow being controlled by BP1 which is generated in the bias circuit and applied to the gate of P121. Subject to this upper limit, as the current in P121, P122 and P123 increases, OUTPPX increases which may cause P117 to partially or completely turn off. This will enable OUTP to quickly decrease to a relatively low voltage to closely track INP, particularly at the low end of the voltage range. To further assist OUTP to quickly and accurately respond to decreases in INP at the low end of the voltage range, transistors N133 and P134 will remain on while transistors N128 and P129 will be partially or completely off to provide some "pull up" charge current at the output node.

Thus, the push-pull output stage efficiently controls current flow at the output node and enables the output signal OUTP of analog buffer 21 to follow its input signal INP very closely during steady-state operation even at the low and high ends of the input voltage range. As a result of this arrangement, analog buffer 21 also draws much less current than the conventional buffer.

Figure 3:
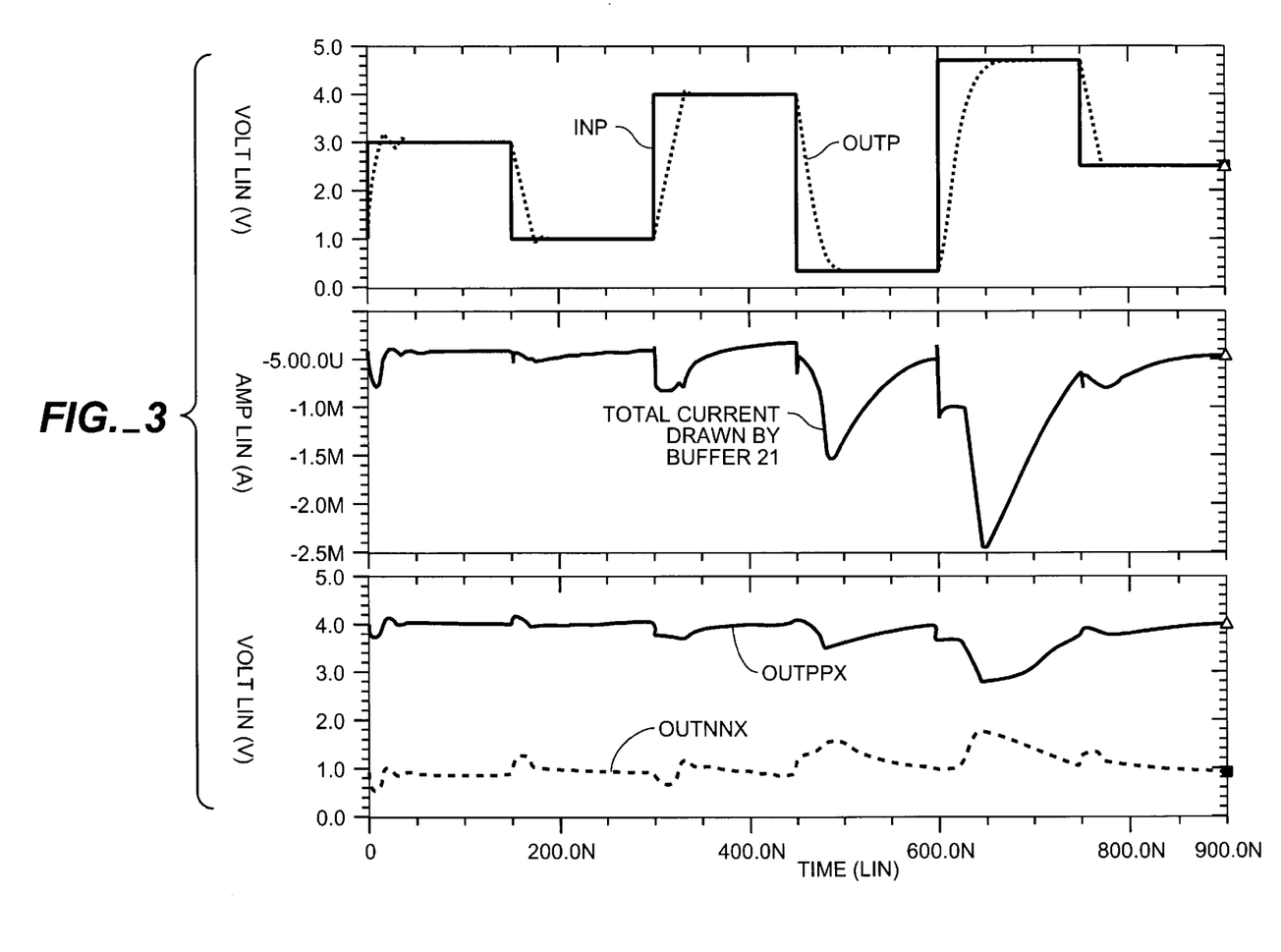
FIG. 3 is a graphical representation of certain performance characteristics of the analog buffer of the present invention.

FIG. 3 graphically illustrates certain performance characteristics of analog buffer 21. The top graph shows the close relationship between the input and output voltage signals over a given time period, the middle graph shows the small amount of current drawn by the buffer 21 over that same time period and the bottom graph shows the variation of voltage signals OUTPPX and OUTNNX over that same time period. Analog buffer 21 typically provides an AC gain of about 2,000 at an input of 2.5 V. Its input/output range is about VSS+0.2 V to about VDD−0.2 V. In FIG.3, VDD=5 V and VSS=0 V.

To make buffer 21 even more efficient, transistors P110 and N116 enables buffer 21 to go into a power down mode when the buffer is idle (i.e., no input signal is applied for some period of time). In the power down mode, the buffer 21 draws only a small amount of dc current (approximately 1–2 $\mu$A) from the power supply. An external power down circuit of any suitable type may be used to generate the complementary power down voltages, PDN and PD. When PDN is high and PD is low, P110 and N116 are off and buffer 21 is in the normal operating mode. When PDN is low and PD is high, P110 and N116 are on and buffer 21 is in the power down mode.

As previously noted, analog buffer 21 is adapted to be used in connection with certain scanner circuit components. These components as well as certain other interrelated scanner circuit components are shown in block diagram form in FIG. 4 and may be fabricated on a single chip identified generally by the reference numeral 200. A correlated double sampling (CDS) circuit 201 samples, holds and amplifies an analog input signal that is gene rated by a charge-coupled device (not shown) in response to the input light signals. The output analog signal generated by the CDS circuit 201 is transmitted to a variable gain amplifier (VGA) 202 where the analog signal is further amplified before it is converted to a digital signal by an analog-to-digital converter (ADC) 203. The digitized signal is then input into a latch circuit 204 from which a digital output signal is generated.

Figure 4:
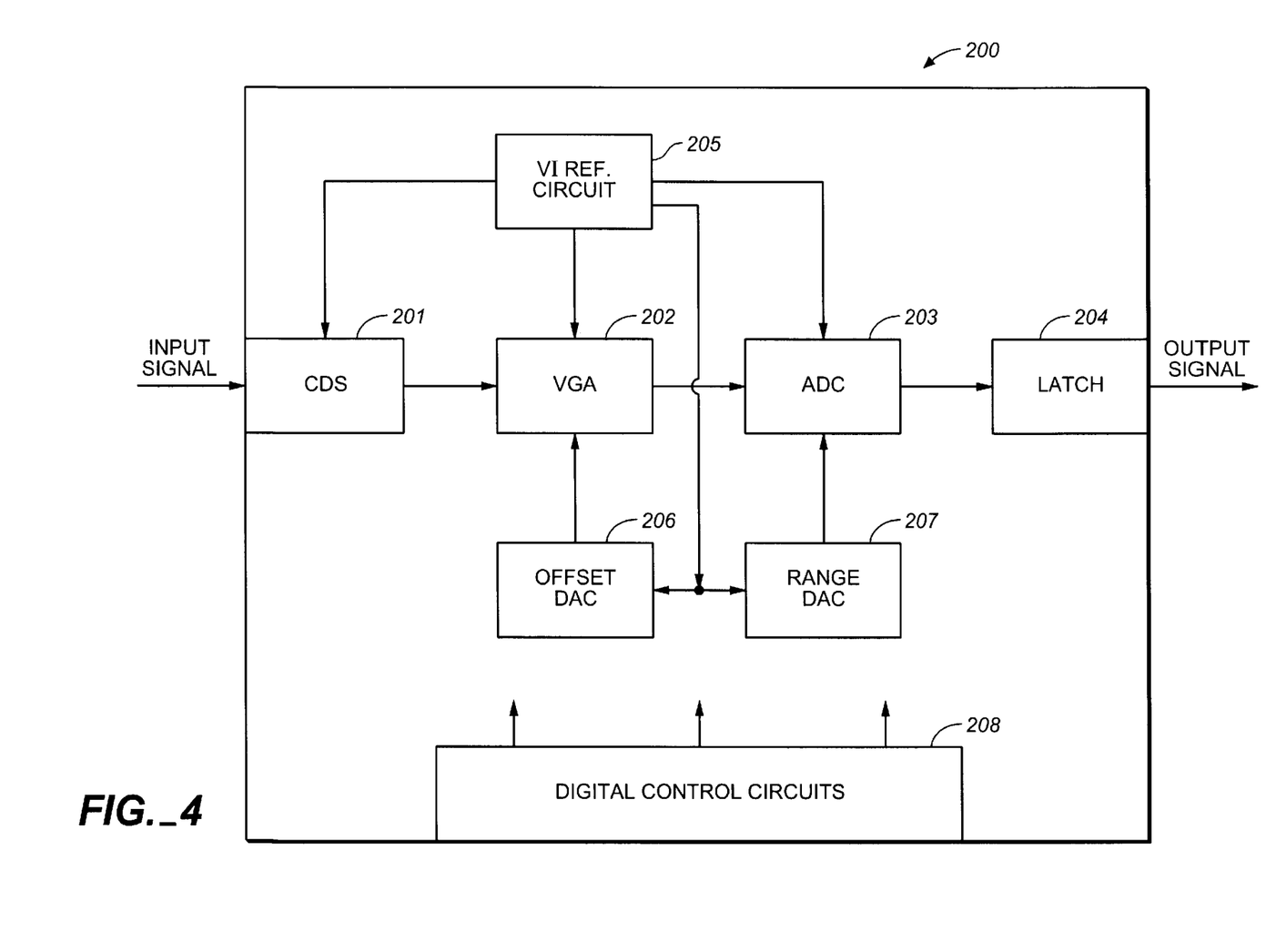
FIG. 4 is a block diagram showing the interconnection of various scanner circuit components, including a voltage-current reference circuit and a range digital-to-analog converter in which the analog buffer of the present invention is adapted to be embodied.

The scanner circuitry shown in FIG. 4 further includes a voltage-current (V-I) reference circuit 205 in which the analog buffer 21 is embodied. The V-I reference circuit 205 provides reference voltage and current signals to CDS circuit 201, VGA 202 and ADC 203. Analog buffer 21 ensures that these references are accurate and that the circuit 205 has a strong driving ability.

An offset digital-to-analog converter (DAC) 206 and a range DAC 207 operate under the control of digital control circuits 208 and uses reference voltage and current signals from the V-I reference circuit 205 to provide analog signals to VGA 202 and ADC 203. Analog buffer 21 is embodied in the range DAC 207 to ensure that the analog signal provided to the ADC 203 is accurate and has a fast response time.

While the invention has been described in conjunction with specific embodiments, it will be evident to those skilled in the art in light of the foregoing description that many further alternatives, modifications and variations are possible. For example, the invention is not limited to scanner and imaging applications but may be used in connection with any application that requires a low power buffer capable of generating an accurate and responsive analog output signal. Thus, the invention herein is intended to embrace all such alternatives, modifications, applications, and variations as may fall within the spirit and scope of the appended claims.

What is claimed is:

1. An analog buffer, comprising:

an input stage comprising a plurality of input MOS transistors for receiving an electrical input signal, a first node where a first electrical control signal is generated, and a second node where a second electrical control signal is generated; and a push-pull output stage comprising an output node where an electrical output signal is generated and a plurality of groups of MOS transistors including a first group of MOS transistors, a second group of MOS transistors, a third group of MOS transistors and a fourth group of MOS transistors, wherein said first group of MOS transistors is responsive to the first electrical control signal to increase the output signal in response to an increase in the input signal, wherein said second group of MOS transistors is responsive to the second electrical control signal to decrease the output signal in response to a decrease in the input signal, wherein said third group of MOS transistors assists in increasing the output signal in response to an increase in the input signal at a relatively high end of the input voltage signal range and wherein said fourth group of MOS transistors assists in decreasing the output signal in response to a decrease in the input signal at a relatively low end of the input voltage signal range.

2. The analog buffer of claim 1, wherein said push-pull output stage further comprises a pair of output transistors, one of which is a PMOS transistor biased by a third electrical control signal and the other of which is an NMOS transistor biased by a fourth electrical control signal, wherein the pair of output transistors have a common drain connection forming the output node where the electrical output signal is generated.

3. The analog buffer of claim 2, further comprising a supply voltage and wherein said first group of MOS transistors comprises a plurality of PMOS transistors connected in series between the supply voltage and a node where the third electrical control signal is generated.

4. The analog buffer of claim 2, wherein said second group of MOS transistors comprises a plurality of NMOS transistors connected in series between a node where the fourth electrical control signal is generated and a node that is grounded or connected to a second supply voltage.

5. The analog buffer of claim 3, further comprising a bias circuit for generating a fifth electrical control signal and wherein one of said plurality of PMOS transistors connected in series is biased by the first electrical control signal and another of said plurality of PMOS transistors connected in series is biased by the fifth electrical control signal.

6. The analog buffer of claim 4, further comprising a bias circuit for generating a sixth electrical control signal and wherein one of said plurality NMOS transistors connected in series is biased by the second electrical control signal and another of said plurality of NMOS transistors connected in series is biased by the sixth electrical control signal.

7. The analog buffer of claim 1, further comprising a bias circuit for generating fifth and sixth electrical control signals and wherein said third group of MOS transistors comprises a PMOS transistor biased by said fifth electrical signal and an NMOS transistor biased by said sixth electrical signal.

8. The analog buffer of claim 1, further comprising a bias circuit for generating fifth and sixth electrical control signals and wherein said fourth group of MOS transistors comprises a PMOS transistor biased by said fifth electrical signal and an NMOS transistor biased by said sixth electrical signal.

9. The analog buffer of claim 1, wherein said input stage comprises:

an n-input stage comprising a pair of input MOS transistors for receiving the electrical input signal, said pair of input MOS transistors being coupled together to form the first node where the first electrical control signal is generated; and a p-input stage comprising a pair of input MOS transistors for receiving the electrical input signal, said pair of input MOS transistors being coupled together to form the second node where the second electrical control signal is generated.

10. An analog buffer, comprising:

an n-input stage comprising a pair of input NMOS transistors for receiving an electrical input signal, said pair of input NMOS transistors being coupled together to form a node where a first electrical control signal is generated;

a p-input stage comprising a pair of input PMOS transistors for receiving the electrical input signal, said pair of input PMOS transistors being coupled together to form a node where a second electrical control signal is generated; and a push-pull output stage comprising a pair of output transistors comprising:

a pair of output transistors including a PMOS transistor biased by a third electrical control signal and an NMIOS transistor biased by a fourth electrical control signal, said pair of output transistors having a common drain connection forming an output node where an electrical output signal is generated, a first group of PMOS transistors, one of which is responsive to the first control signal to increase the output signal in response to an increase in the input signal, a second group of NMOS transistors, one of which is responsive to the second control signal to decrease the output signal in response to a decrease in the input signal, a third group of MOS transistors comprising a PMOS and an NMOS transistor to assist in increasing the output signal in response to an increase in the input signal at a relatively high end of the input voltage signal range, and a fourth group of MOS transistors comprising a PMOS and an NMOS transistor to assist in decreasing the output signal in response to a decrease in the input signal at a relatively low end of the input voltage signal range.

11. An analog buffer, comprising:

means for receiving an electrical input signal and for generating first and second electrical control signals; and means for generating an electrical output signal, said generating means comprising a plurality of groups of MOS transistors including a first group of MOS transistors, a second group of MOS transistors, a third group of MOS transistors and a fourth group of MOS transistors, wherein said first group of MOS transistors is responsive to the first electrical control signal to increase the output signal in response to an increase in the input signal, wherein said second group of MOS transistors is responsive to the second electrical control signal to decrease the output signal in response to a decrease in the input signal, wherein said third group of MOS transistors assists in increasing the output signal in response to an increase in the input signal and wherein said fourth group of MOS transistors assists in decreasing the output signal in response to a decrease in the input signal.

12. The analog buffer of claim 11, wherein said output signal generating means further comprises a pair of output transistors, one of which is a PMOS transistor biased by a third electrical control signal and the other of which is an NMOS transistor biased by a fourth electrical control signal, wherein the pair of output transistors have a common drain connection forming the output node where the electrical output signal is generated.

13. The analog buffer of claim 12, further comprising means for supplying a voltage and wherein said first group of MOS transistors comprises a plurality of PMOS transistors connected in series between said voltage supply means and a node where the third electrical control signal is generated.

14. The analog buffer of claim 12, wherein said second group of MOS transistors comprises a plurality of NMOS transistors connected in series between a node where the fourth electrical control signal is generated and a node that is grounded or connected to a second means for supplying a voltage.

15. The analog buffer of claim 13, further comprising means for generating a fifth electrical control signal and wherein one of said plurality of PMOS transistors connected in series is biased by the first electrical control signal and another of said plurality of PMOS transistors connected in series is biased by the fifth control signal.

16. The analog buffer of claim 14, further comprising means for generating a sixth electrical control signal and wherein one of said plurality NMOS transistors connected in series is biased by the second electrical control signal and another of said plurality of NMOS transistors connected in series is biased by the sixth electrical control signal.

17. The analog buffer of claim 11, further comprising means for generating fifth and sixth electrical control signals and wherein said third group of MOS transistors comprises a PMOS transistor biased by said fifth electrical signal and an NMOS transistor biased by said sixth electrical signal.

18. The analog buffer of claim 11, further comprising means for generating fifth and sixth electrical control signals and wherein said fourth group of MOS transistors comprises a PMOS transistor biased by said fifth electrical signal and an NMOS transistor biased by said sixth electrical signal.

19. An apparatus, comprising:
    an analog buffer, comprising:
        an input stage comprising a plurality of input MOS transistors for receiving an electrical input signal, a first node where a first electrical control signal is generated, and a second node where a second electrical control signal is generated;
        a push-pull output stage comprising an output node where an electrical output signal is generated and a plurality of groups of MOS transistors including a first group of MOS transistors and a second group of MOS transistors, wherein said first group of MOS transistors is responsive to the first electrical control signal to increase the output signal in response to an increase in the input signal and wherein said second group of MOS transistors is responsive to the second electrical control signal to decrease the output signal in response to a decrease in the input signal;
    a sampling circuit;
    an amplifier in electrical communication with the sampling circuit; and
    a voltage-current reference circuit which includes the analog buffer for providing reference voltage and current signals to the sampling circuit and the amplifier.

20. The apparatus of claim 19, wherein the sampling circuit is a correlated double sampling circuit, and wherein the amplifier is a variable gain amplifier, said apparatus further comprising an analog-to-digital converter in electrical communication with the variable gain amplifier, and wherein the voltage-current reference circuit also provides reference voltage and current signals to the analog-to-digital converter.

21. The apparatus of claim 20, further comprising a latch circuit in electrical communication with the analog-to-digital converter.

22. The apparatus of claim 21, further comprising an offset digital-to-analog converter and a range digital-to-analog converter including the analog buffer, wherein the offset digital-to-analog converter and range digital-to-analog converter are in electrical communication with each other and each receives reference voltage and current signals from the voltage-current reference circuit for controlling the variable gain amplifier and the analog to-digital converter.

23. The apparatus of claim 22, further comprising digital control circuits for controlling the offset digital-to-analog converter and the range digital-to-analog converter.

24. The apparatus of claim 23, wherein the correlated double sampling circuit, the variable gain amplifier, the analog-to-digital converter, the latch circuit, the voltage-current reference circuit, the offset digital-to-analog converter, the range digital-to-analog converter, and the digital control circuits are fabricated on a single chip.

25. A method of making an analog buffer, comprising:
    providing an input stage comprising a plurality of input MOS transistors connected to receive an electrical input signal, a first node where a first electrical control signal is generated, and a second node where a second electrical control signal is generated; and
    providing a push-pull output stage comprising a output node where an electrical output signal is generated and a plurality of groups of MOS transistors including a first group of MOS transistors, a second group of MOS transistors, a third group of MOS transistors and a fourth group of MOS transistors, wherein said first group of MOS transistors is responsive to the first electrical control signal to increase the output signal in response to an increase in the input signal, wherein said second group of MOS transistors is responsive to the second electrical control signal to decrease the output signal in response to a decrease in the input signal, wherein said third group of MOS transistors assists in increasing the output signal in response to an increase in the input signal at a relatively high end of the input voltage signal range and wherein said fourth group of MOS transistors assists in decreasing the output signal in response to a decrease in the input signal at a relatively low end of the input voltage signal range.

* * * * *

UNITED STATES PATENT AND TRADEMARK OFFICE
CERTIFICATE OF CORRECTION

PATENT NO.    : 6,066,985
DATED         : May 23, 2000
INVENTOR(S)   : Ping Xu

It is certified that an error appears in the above identified patent and that said Letters Patent is hereby corrected as shown below:

Column 8, line 26 change "NMIOS" to --NMOS--

Signed and Sealed this

Seventeenth Day of April, 2001

Attest:

NICHOLAS P. GODICI

Attesting Officer    Acting Director of the United States Patent and Trademark Office